United States Patent
Hyde et al.

(10) Patent No.: US 7,473,499 B2
(45) Date of Patent: *Jan. 6, 2009

(54) ELECTROACTIVE POLYMERS FOR LITHOGRAPHY

(75) Inventors: Roderick A. Hyde, Livermore, CA (US); Nathan P. Myhrvold, Medina, WA (US)

(73) Assignee: Searete LLC, Bellevue, WA (US)

( * ) Notice: Subject to any disclaimer, the term of this patent is extended or adjusted under 35 U.S.C. 154(b) by 637 days.

This patent is subject to a terminal disclaimer.

(21) Appl. No.: 11/132,736

(22) Filed: May 19, 2005

(65) Prior Publication Data

US 2006/0264015 A1 Nov. 23, 2006

(51) Int. Cl.
- *H01L 41/08* (2006.01)
- *H01L 21/22* (2006.01)
- *H01L 21/683* (2006.01)

(52) U.S. Cl. .......................... 430/5; 310/328; 310/330; 310/800

(58) Field of Classification Search .................... 430/5; 310/328, 330, 800
See application file for complete search history.

(56) References Cited

U.S. PATENT DOCUMENTS

| | | | |
|---|---|---|---|
| 6,365,326 B1 | 4/2002 | Surendra et al. | |
| 6,433,465 B1 | 8/2002 | McKnight et al. | |
| 6,521,383 B2 | 2/2003 | Surendra et al. | |
| 6,543,110 B1 * | 4/2003 | Pelrine et al. | 29/25.35 |
| 6,586,859 B2 * | 7/2003 | Kornbluh et al. | 310/309 |
| 6,681,849 B2 | 1/2004 | Goodson, Jr. | |
| 6,696,220 B2 | 2/2004 | Bailey et al. | |
| 6,753,131 B1 | 6/2004 | Rogers et al. | |
| 6,781,284 B1 * | 8/2004 | Pelrine et al. | 310/330 |
| 6,806,621 B2 | 10/2004 | Heim et al. | |
| 6,809,462 B2 | 10/2004 | Pelrine et al. | |
| 2003/0080442 A1 | 5/2003 | Unger | |
| 2003/0141473 A1 | 7/2003 | Pelrine et al. | |
| 2007/0058323 A1* | 3/2007 | Hyde et al. | 361/234 |

OTHER PUBLICATIONS

Bar-Cohen, Yoseph; "Electroactive Polymers as Artificial Muscles—Reality and Challenges"; Proceedings of the 42nd AIAA Structures, Structural Dynamics, and Materials Conference (SDM), Gossamer Spacecraft Forum (GSF); bearing dates of Apr. 16-19 2001; pp. 1-10; Paper #2001-1492; Seattle, Washington; located at http://ndeaa.jpl.nasa.gov/ndeaa-pub/AIAA/AIAA-EAP-review-2001.pdf.

Cohen, J.Y.; "Electroactive Polymers as Artificial Muscles—A Primer"; bearing dates of 2003 and Nov. 19, 2004; pp. 1-14; located at http://polysep.ucla.edu/Research%20Advances/EAP/electroactive_polymers_as_artifi.htm; printed on Apr. 15, 2005.

Xia, Younan; Whitesides, George M.; "Soft Lithography"; Annual Review Master Science; bearing a date of 1998; pp. 153-184; vol. 28:153-84; located at http://web.mit.edu/10.491/softlithographyreview.pdf.

U.S. Appl. No. 11/580,526, Hyde et al.
U.S. Appl. No. 11/413,958, Hyde et al.
PCT International Search Report; International App. No. PCT/US07/10305; Jul. 22, 2008; pp. 1-3.

* cited by examiner

*Primary Examiner*—Nikita Wells

(57) ABSTRACT

Systems and methods for lithography include actuating an electroactive polymer member to position mask and/or substrate.

67 Claims, 3 Drawing Sheets

ELECTROACTIVE POLYMERS FOR LITHOGRAPHY

BACKGROUND

Currently, lithography is the most complicated and expensive process in mainstream microelectronic fabrication. As required chip feature sizes grow ever smaller, lithography techniques are continually updated to achieve the desired resolution. A significant component of the cost of lithography is the cost of manufacture of lithography masks. For certain types of lithography, greater resolution may be achievable using contact methods, in which a mask is placed in contact with a substrate, but these techniques may also risk damage to the mask and/or the substrate. Proximity printing techniques may avoid damage due to contact between the mask and the substrate, but may require fine control over the exact offset distance between the mask and substrate. Projection lithography systems keep the mask relatively remote from the substrate, but may be limited in resolution due to limitations in depth of field for high numerical aperture optics.

SUMMARY

In one aspect, a lithography apparatus comprises a mask holder having a mask location, a substrate holder having a substrate location, and a positioner that shifts the relative positions of the mask holder and the substrate holder from a first arrangement to a second arrangement, where the second arrangement has a selected relationship between the mask location and the substrate location. The positioner includes an electroactive polymer member that shifts the relative positions from the first arrangement to the second arrangement.

The apparatus may also include an electrode in electrical communication with the electroactive polymer member. Application of a voltage to the electrode actuates the electroactive polymer member. Alternatively, the electroactive polymer member may be actuated by application of a magnetic field.

In the second arrangement, the mask position may be offset from the substrate position by substantially uniform offset distance, for example, a distance of about 5 µm to about 100 µm, about 1 µm to about 5 µm, less than about 1 µm, less than about 100 nm, or less than about 10 nm.

The apparatus may also include a distance sensor that monitors relative positioning of the mask position and the substrate position, and a controller that controls the shifting of the positioner in response to the distance sensor. The distance sensor may monitor the distance between the mask position in the substrate position at a plurality of locations. The positioner may include a plurality of active regions, and the controller may separately control the shifting of each active region, for example in response to the monitored distance between the mask position and the substrate position at the plurality of locations. The distance sensor may monitor the relative positioning of the mask position and the substrate position, for example by measuring a capacitance, by measuring an inductance, by optical measurement, by using an atomic force measurement, or by using evanescent wave coupling.

In the second arrangement, a mask in the mask position and a substrate in the substrate position may be in contact. The apparatus may include a force sensor that monitors a contact force between the mask and the substrate, and may also include a controller that controls the shifting of the positioner in response to the monitored contact force. The force sensor may monitor contact forces at a plurality of locations. The positioner may include a plurality of active regions, and the controller may separately control the shifting of each active region, for example in response to the monitored contact force.

The apparatus may also include a stage that brings the mask position and the substrate position into the first arrangement. The positioner may shift the relative positions of the mask holder and the substrate holder by moving the mask holder, or it may shift the relative positions a mask holder and the substrate holder by moving the substrate holder. In either case, the apparatus may include a spacer interposed between the positioner and the mask holder or the substrate holder.

The positioner may acts to flatten a mask in the mask position or a substrate in the substrate position. For example, the positioner may comprise a plurality of active regions, and each active region may be separately actuated to shift an adjacent portion of the mask or the substrate.

The lithographic apparatus may also comprise an energy source positioned to direct an energy flux through the mask position to the substrate position. The energy flux may be, for example, electromagnetic radiation, an electron beam, an ion beam, or an x-ray beam. The apparatus may also include a beam directing elements, for example a lens, a mirror, or an electromagnetic field generator. The apparatus may also comprise a mask that emits light in the mask location. For example, the mask may include a light emitting diode or may fluoresce.

The apparatus may include a mask in the mask location and a substrate in the substrate location, where the mask has a physical effect on a surface of the substrate when the mask and the surface of the substrate are brought into contact. The chemical composition of the surface may be changed by contact with the mask, for example by transferring a functional group from the mask to the substrate, or from the substrate to the mask. The substrate may include a surface coating of a resist composition, and the physical effect may be a chemical change in the resist composition.

The electroactive polymer member may include a material selected from the group consisting of ferroelectric polymers, dielectric polymers, electrostrictive polymers, electroviscoelastic polymers, liquid crystals, ionic polymers, carbon nanotubes, electrorheological polymers, and magnetoreological polymers, and it may be an elastomer.

In another aspect, a mask moving system includes a mask holder and an electroactive polymer member, coupled for force transfer to the mask holder. It may also include a controller that controls a degree of actuation of the electroactive polymer member, and/or an electrode in electrical communication with the electroactive polymer member, where application of a voltage to the electrode actuates the electroactive polymer member. The electroactive polymer member may also be actuated by application of a magnetic field.

The system may also include a position monitor coupled to detect the position of the mask holder relative to a substrate, for example by detecting a contact force and/or a distance, at one or more locations. Distance may be monitored optically, capacitively, inductively, using an atomic force measurement, or by evanescent wave coupling. The system may also include a controller that controls a degree of actuation of the electroactive polymer member in response to the detected position.

The electroactive polymer member of the mask moving system may comprise a plurality of separately actuatable regions. The system may further comprise a controller that independently actuates each member of the plurality of separately actuatable regions. The separately actuatable regions may be arranged so that actuating a subset of them deforms a mask in the mask holder. The system may also include a position monitor coupled to detect the position of the mask holder relative to a substrate at one or more positions, for example by monitoring contact force or distance, and the detected position of the mask holder may be used to control the degree of actuation of the electroactive polymer member. Distance may be monitored, for example, optically, capacitively, inductively, by atomic force measurement, or by evanescent wave coupling. The controller may be responsive to the position monitor.

In another aspect a lithographic apparatus comprises an illumination system and a positioning apparatus including an electroactive polymer-based movement mechanism. The illumination system is oriented to provide activating energy to an illumination site. The apparatus may also include an object holder configured to position an object in proximity to the illumination site, and/or a substrate support configured to hold a substrate substantially at the illumination site. The positioning apparatus may be configured to provide relative movement of the illumination site and the object, or to move the illumination site. The electroactive polymer-based movement mechanism may be coupled to the object holder. The activating energy may be, for example, electromagnetic radiation, an electron beam, an ion beam, or an x-ray beam. The apparatus may also include a beam directing element that directs the activating energy, such as a lens, a mirror, or an electromagnetic field generator. The illumination means may provide activating energy to the illumination site in a spatial pattern.

In another aspect, a controller for lithographic system comprises a receiver that receives a distance measurement signal, a processor that uses the distance measurement signal to determine an actuation profile for an electroactive polymer member, and an output that actuates the electroactive polymer member according to the actuation profile. The distance measurement signal may be produced by measuring a distance between a mask in a substrate and/or may comprise a plurality of distance measurements. The actuation profile may comprise a single degree of actuation or a plurality of actuation signals. In the latter case, each actuation signal may be directed to an active region of the electroactive polymer member. The electroactive polymer member may be positioned to shift a first surface relative to a second surface, and the actuation profile may be selected to bring the first surface to a predetermined distance from the second surface, or the actuation profile may be selected to conform the first surface to the second surface.

In another aspect, a controller for a lithographic system comprises a receiver that receives a force measurement signal, a processor that uses the force measurement signal to determine an actuation profile for an electroactive polymer member, and an output that actuates the electroactive polymer member according to the actuation profile. The force measurement signal may be produced by measuring a force between a mask in a substrate, and/or may comprise a plurality of force measurements. The actuation profile may comprise a single degree of actuation or a plurality of actuation signals. In the latter case each actuation signal may be directed to an active region of the electroactive polymer member. The electroactive polymer member may be positioned to shift a first surface relative to a second surface, and the actuation profile may be selected to bring the first surface into contact with the second surface at a predetermined contact force, or the actuation profile may be selected to conform the first surface to the second surface.

In another aspect to a lithographic method comprises positioning a mask proximate to the substrate in shifting the relative positions of the mask and the substrate by actuating electroactive polymer member. The method may also include monitoring a distance between the mask and the substrate, at one or at a plurality of locations. The electroactive polymer member may comprise a plurality of separately actuatable active regions and actuating the electroactive polymer member may include separately actuated a subset of the separately actuatable active regions in response to the monitored distance or distances. The method may include maintaining a selected distance between the mask and the substrate (e.g., in the range of about 5 µm to about 100 µm, in the range of about 10 µm to about 50 µm, in the range of about 1 µm to about 5 µm, less than about 1 µm, less than about 100 nm, or less than about 10 nm) by using the monitored distance as a feedback signal to adjust a degree of actuation of the electroactive polymer member.

Shifting the relative position of the mask and the substrate may include bringing the mask and the substrate into contact and further may include monitoring a contact force between them, at one or at a plurality of locations. The monitored contact force may be used as a feedback signal to adjust a degree of actuation of the electroactive polymer member. The electroactive polymer member may comprise a plurality of separately actuatable active regions, a subset of which may be separately actuated in response to the monitored contact forces. Positioning the mask proximate to the substrate may include moving the mask or the substrate with a stage.

Changing the position or shape of the electroactive polymer member may flatten the substrate or mask. The method may also include measuring flatness of the substrate or mask. The electroactive polymer member may comprise a plurality of separately actuatable active regions, a subset of which may be separately actuated in response to the measured flatness of the substrate or mask. The substrate or mask flatness measurement may be done prior to or concurrently with actuating the electroactive polymer member.

The method may also include exposing the substrate to an energy flux through the mask. For example, the energy flux may be electromagnetic radiation, an electron beam, an ion beam, or an x-ray beam. The substrate may be coated with a resist composition and the energy flux may cause a chemical change in the resist composition. The method may further comprise removing either resist composition exposed to the energy flux or resist composition not exposed to the energy flux.

The method may also include exposing the substrate to an energy flux from the mask. For example, a voltage may be applied to the mask, either while it is in contact with the substrate or while it is offset from the substrate. Alternatively, the mask may emit light. For example, the mask may include a light-emitting diode, or at least a portion of the mask may fluoresce.

The method may also include causing a physical effect on the surface of the substrate by contact with the mask. The physical effect may be changing the chemical composition of the surface, for example by transferring a functional group from the mask to the substrate or from the substrate to the mask. The substrate may include a surface coating of a resist composition and the physical effect may be a chemical change in the resist composition.

The electroactive polymer member may comprise a material selected from the group consisting of ferroelectric polymers, dielectric polymers, electrostrictive polymers, electroviscoelastic polymers, liquid crystals, ionic polymers, carbon nanotubes, electrorheological polymers, and magnetorheological polymers, and/or it may include an elastomer.

In another aspect, a method of positioning a mask comprises applying a force with an electroactive polymer. Applying a force may include applying a force to a mask moving mechanism, which may include a mask holder. The method may also include positioning a mask in a first location in a lithographic system, and may further include moving the mask from the first location to an imaging location. The motion from the first location to the imaging location that may be responsive to applying the force with the electroactive polymer. Applying a force may include the forming the mask, for example by flattening it or by conforming it to a substrate.

DETAILED DESCRIPTION

Electroactive polymers respond to electrical or magnetic stimulation by changing or tending to change shape. Polymers may use a wide variety of mechanisms to achieve this behavior, including but not limited to ferroelectric polymers, dielectric polymers, electrostrictive polymers, electroviscoelastic polymers, liquid crystals, ionic polymers, carbon nanotubes, electrorheological polymers, and magnetorheological polymers. Many such polymers may exhibit desirable features such as high actuation strains, mechanical resilience, and good response times.

Either the mask, the substrate, or both may be positioned in a lithographic system with an electroactive polymer. Particularly in a contact lithography system, it may be desirable to use a relatively resilient polymer (e.g., a polymer that is partially or fully elastomeric). This may minimize contact forces and resulting damage to either the mask or the substrate. A resilient polymer may also help conform the mask to the substrate (or vice versa).

Electroactive polymers can provide a fine degree of control of position of the mask and/or the substrate. Their relatively high actuation strains and fast response times can allow precise positioning, while their resilience can provide a more robust system. A fine degree of control and the ability to monitor and correct flatness of the substrate and/or the mask may be helpful in projection lithography systems, and to provide adequate focus in systems having optical systems with limited numerical apertures. Fine control may also be applicable in proximity printing systems, where a small offset can enhance resolution at a risk of damage to mask and/or substrate, if they are allowed to contact. Electroactive polymers may also be adapted operate as part of force-feedback systems, which may be applicable in contact lithography. Their resilience may also help minimize damage due to contact in both proximity and contact lithography systems.

Figure 1:
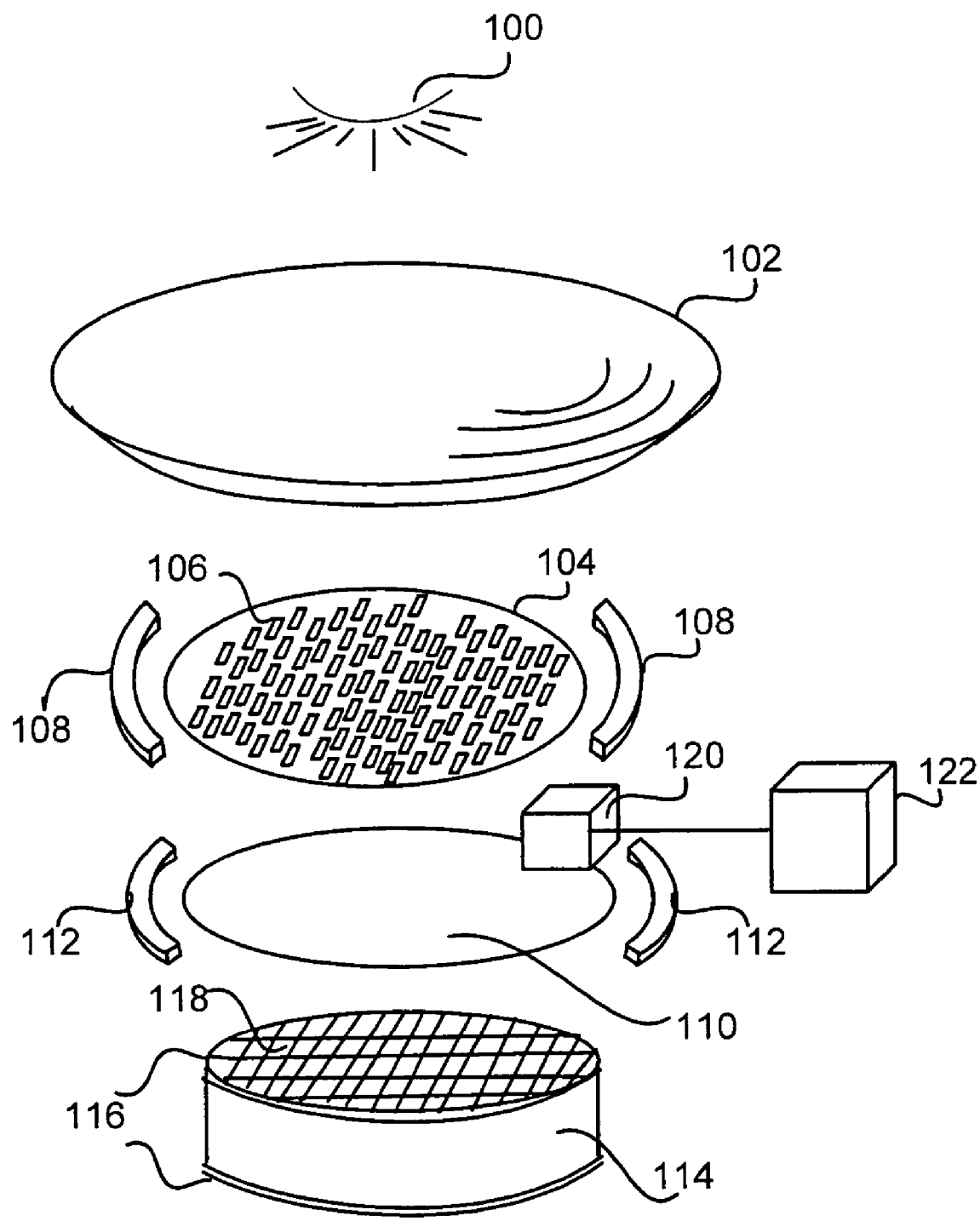
FIG. 1 shows schematically a lithography system.

FIG. 1 shows schematically one embodiment of a lithography system. Illumination source 100 may be a light source (optical lithography), an x-ray source, an electron or ion beam source, or any other source of an energy flux that can be used for lithography. Illumination may be continuous, burst, or intermittent, as is typically defined by configurations and parameters of the lithography system. In the illustrated system, light is focused by lens 102. While the embodiment of FIG. 1 incorporates the lens 102, any other beam-directing, shaping, splitting, filtering, or polarizing element or combination of elements, or any other optically interactive elements may direct, process, shape or otherwise interact with an energy flux to provide illumination appropriate for the system. Such elements may include mirrors, electromagnetic fields (which may be static or dynamic), diffractive elements, refractive elements, lenses, or any other optical elements appropriate for the configuration. "Optical element" or "beam-directing element," as used herein, is intended to include all elements suitable for changing the direction, focus, polarization, or other properties of the illumination energy flux, which may be, but need not be, electromagnetic energy of any type (e.g., "optical elements" in this context include electromagnetic fields that may be used to direct electron or ion beams). Morever, in some applications, the illumination may be used direct from the source 100 without any beam-directing elements. Also, although the lens 102 is represented by a symbol typically associated with a refractive lens, other types of lenses may be incorporated, including Fresnel lenses, diffractive lenses, or other types of lenses or combinations of lenses. Further, although the representation of FIG. 1 shows an optical element, represented by lens 102, between the light source 100 and the mask, beam-directing or handling elements may also optionally be positioned after mask 104, or elsewhere in the lithography system.

In the illustrated system, after light has been focused by lens 102, it passes through apertures 106 in mask 104, which is held in place by mask holder 108. Light that passes through the apertures 106 impinges on substrate 110, replicating the pattern of the mask. The distance between mask 104 and substrate 110 has been greatly increased in FIG. 1 for clarity; though close proximity of mask and substrate generally promotes resolution and may be appropriate in many lithography systems. In proximity photolithography systems, distances between mask and substrate are currently often in the range of about 5 μm to about 100 μm, or of about 10 μm to about 50 μm, but shorter or longer offsets are also contemplated, including effectively zero distances in the case of contact lithography. In particular, since diffraction effects in proximity systems are minimized when offsets are small, it is contemplated that distances between mask and substrate may be as low as about 1 μm, 100 nm, or even 10 nm. Projection printers, on the other hand, that may hold mask and wafer at arbitrarily large distances from one another, and typically include optical elements between the mask and the wafer, may also be used with electroactive polymer members as described below.

As shown in FIG. 1, substrate holder 112 holds substrate 110 in position, while electroactive polymer member 114 is in direct contact with the back of the substrate 110. Optionally, a spacer (not shown) may be interposed between the electroactive polymer member 114 and the substrate 110, or the electroactive polymer member may be in contact with the substrate holder, rather than the substrate. Electrodes 116 apply a voltage to the electroactive polymer to actuate it, causing it to lift or lower the substrate 110, for example to place the substrate 110 in an image plane of the imaging system. In the embodiment shown in FIG. 1, the electroactive polymer member 114 comprises multiple active regions 118, which can be separately actuated by separately addressable electrodes, though in some configurations a single polymer member or pairs of polymer members may be appropriate. These active regions 118 allow the substrate to be lifted or lowered at selected points, for example to flatten it, or to avoid placing pressure on particularly sensitive areas of an inhomogeneous substrate.

An optional distance sensor 120 is illustrated schematically in FIG. 1. Other embodiments may include plurality of distance sensors, or a single sensor that monitors the distance between the mask 104 and substrate 110 at a plurality of locations. If present, sensor 120 may be coupled to optional controller 122, which may provide a feedback signal to electroactive polymer member 114. In such embodiments, the feedback signal may be used to adjust the actuation of electroactive polymer member 114. For example, the feedback signal may be used to shift the substrate to a desired imaging location, or to apply different actuations to different active regions 118, for example to flatten the substrate or to conform it to the mask.

Distance sensors may use any appropriate technology, such as but not limited to capacitive distance monitoring, inductive distance monitoring, or optical distance monitoring (which includes monitoring in any electromagnetic frequency range, including X-ray monitoring). In some embodiments, including but not limited to those having distances between mask and substrate in the range of about 10 nm to about 100 nm, distance measurement may be achieved by interaction of evanescent waves from one surface with the opposing surface (e.g., "plasmon tomography"). In other embodiments, atomic force measurement may be used to monitor distance between mask and substrate. In some embodiments, a single sensor measures distance between mask and substrate either at a single point or as an average over some or all of the mask/substrate overlap area. In other embodiments, one or more sensors monitor the distance at two or more points. In some applications a larger number of sensors, that may be greater than 1,000, may be appropriate.

Figure 2:
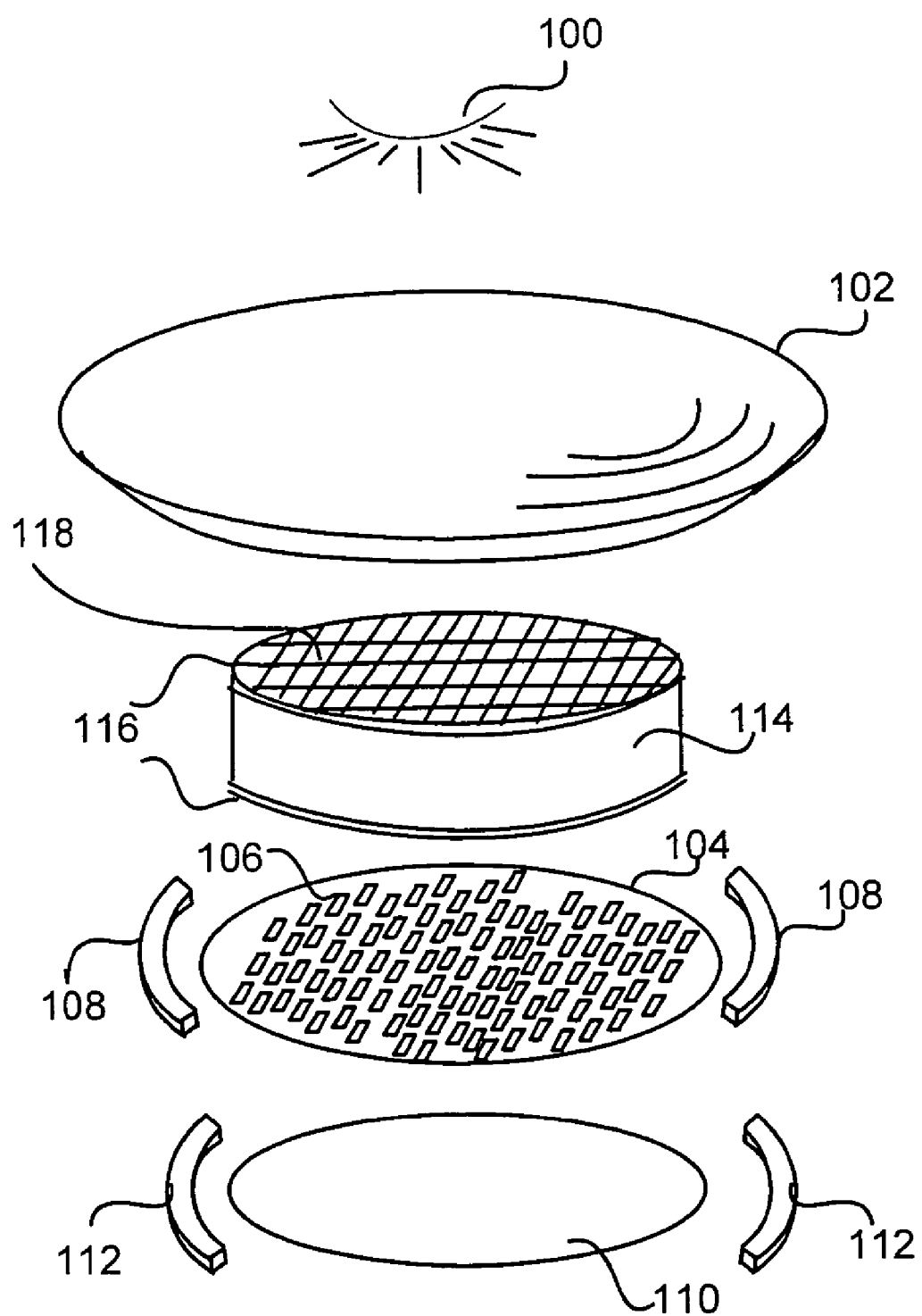
FIG. 2 shows schematically another lithography system.

Another embodiment is illustrated in FIG. 2. In this embodiment, the electroactive polymer member 114 is positioned above the mask 104, and is arranged to shift the mask, for example into a desired imaging location. The member could also be placed below the mask, between it and the substrate. In either case, a spacer (not shown) may optionally be placed between the mask 104 and the electroactive polymer member 114, and/or the member 114 may act to shift the mask holder 108, rather than the mask directly. Although not shown in FIG. 2, the distance sensor 120 and/or the controller 122 of FIG. 1 may also be employed in the configuration of FIG. 2. As was shown in FIG. 1, the electroactive polymer member may comprise active regions 118 which are separately actuable. In the embodiment shown, at least a portion of the electroactive polymer member 114 is at least partially transparent to the illumination, so that illuminating energy passes through the member 114 to reach the mask 104 and eventually the substrate 110. This transparency may be a function of the polymer and illumination source 100 selected, or may be achieved by other means, such as apertures in the member 114 or the use of a composite member 114 having regions of a transparent or translucent material.

In other embodiments (which may, but are not required to, use any of the above-described configurations of mask, substrate, and electroactive polymer member), the illumination source may be incorporated in, integral to, or carried by the electroactive polymer member 114 or the mask 104 itself. For example, the mask may include as an integral portion or a discrete portion, a patterned light emitter, such as an LED-based emitter, or fluorescent regions that can be stimulated to emit photons. For example, in one embodiment, the mask may be stimulated by light of a frequency to which a photoresist on the substrate is insensitive. Patterned fluorescent regions in the mask may then emit light that exposes the photoresist.

Similarly, the electroactive polymer member 114 may include a light-emitting layer, either at the surface or internally, that produces the light that passes through mask 104. The electroactive polymer member 114 or the mask 104 may also supply a non-optical energy flux to the substrate, for example by applying a voltage to the mask that affects the adjacent substrate.

In still other embodiments, no illumination system is used. Such "soft lithography" systems are described, for example, in Xia and Whitesides, "Soft Lithography," *Annu. Rev. Mater. Sci.* 1998, 28:153-184, which is incorporated by reference herein for all that it teaches and suggests. In these approaches, mask 104 is typically used as a stamp or mold to alter the chemistry or form of the substrate in the areas in which it contacts the substrate. In some of these embodiments, a resilient (e.g., elastomeric) electroactive polymer member can to allow the mask 104 to conform to the substrate 110. In other embodiments, a relatively stiff electroactive polymer may be used, and the mask may be conformed to a substrate that is not perfectly flat by actuating different regions of the electroactive polymer member to different degrees, as discussed above.

Either single-point or multiple-point sensors may be combined with the electroactive polymer members having multiple active regions, discussed above. The sensor(s) may detect any variations from a desired shape (e.g., warping) for the mask and/or the substrate, which the electroactive polymer member can then compensate for by applying different levels of actuation to different active regions. Distance measurements may be relative (e.g., measuring the distance between the mask and the substrate), or absolute (e.g., measuring the flatness of the mask and/or the substrate).

Lithography systems, particularly (but not only) contact lithography systems and soft lithography systems, may also use one or more force sensors to monitor a relationship between the mask and the substrate. Such sensors may provide feedback to guide actuation of the electroactive polymer, for example to avoid damage to the substrate and/or the mask caused by excessive pressure. In embodiments including an electroactive polymer member having multiple active regions, the feedback signal can be used to selectively adjust pressure in different active regions.

In some embodiments, it may be useful to employ both distance and force sensors. For example, in some lithography systems, the mask may "sag" and contact the substrate in some regions, but not others. In such cases, force sensors may be desirable to monitor areas with contact, while distance sensors monitor areas without contact. A mask and/or substrate may also include raised structures outside the main area that act as guides to alignment. In such embodiments, it may be desirable to employ force sensor in the area of the raised structure, and a distance sensor in the main area.

Figure 3:
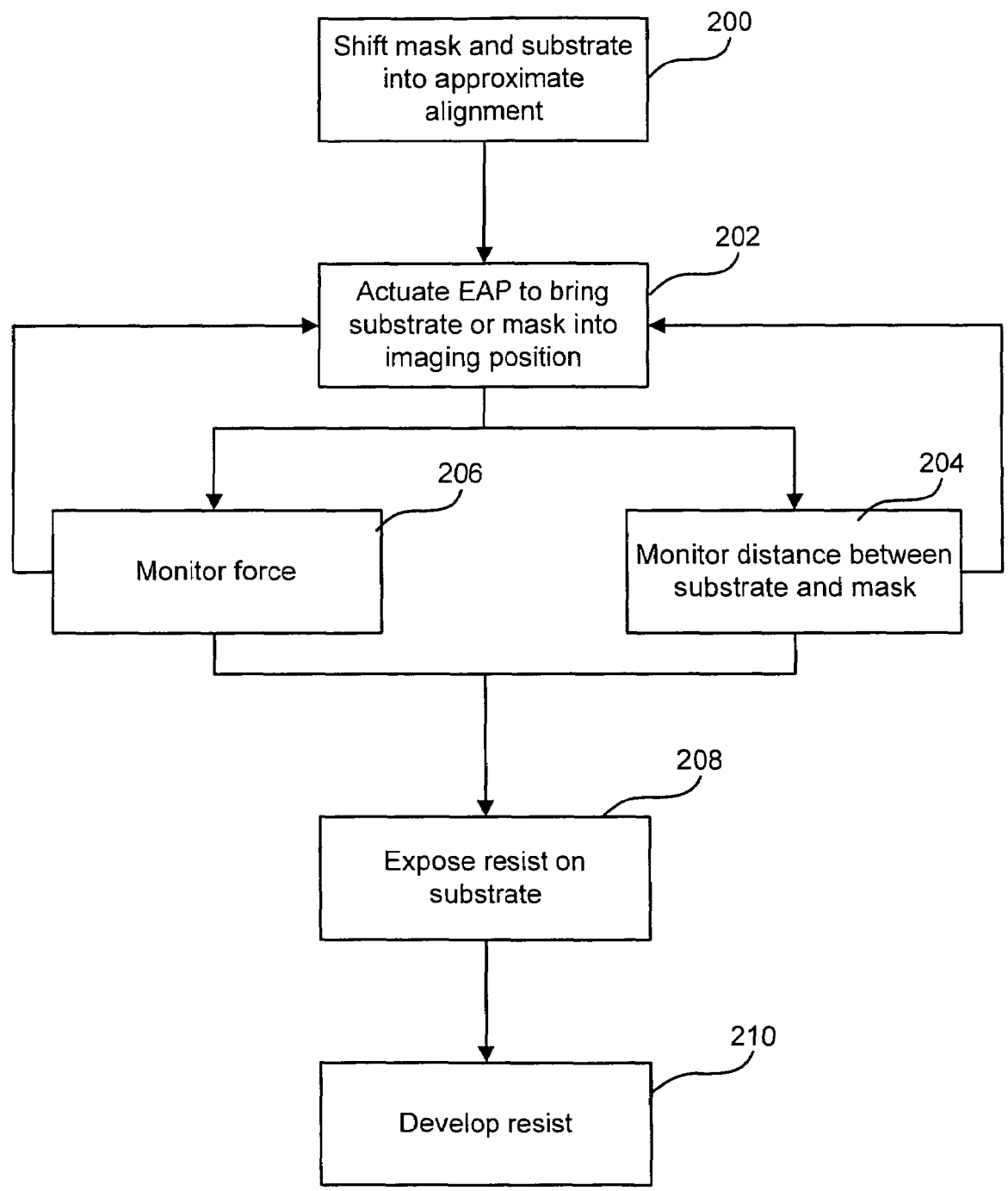
FIG. 3 shows a flow chart illustrating operation of a lithographic method.

FIG. 3 is a flow chart illustrating a lithographic method. As shown, the first step 200 is to approximately align the mask and the substrate, for example by moving one or both with a motorized stage. Next, an electroactive polymer member is actuated 202 to shift the mask and/or the substrate towards an imaging position. In one approach, the electroactive polymer is actuated by applying a voltage under control of an electronic system controller containing appropriate computer instructions. Optionally, the distance between the mask and the substrate 204 and/or the force between the mask and the substrate 206 may be monitored as described previously. The sensors output a signal that is provided to the electronic system controller as a feedback signal. In response, the electronic system controller adjusts the actuation of the electroactive polymer member to bring the mask and/or the substrate into the imaging position. Once the mask and substrate are positioned, a resist on the substrate may be exposed 208. This step may include, for example, exposing a photoresist to electromagnetic radiation, exposing an electrical resist to an electron or other particle beam, or chemically altering a resist by contact with the mask in a soft lithography system. Finally, the exposed resist is typically developed 210, in either a negative resist process (which removes unexposed resist), or a positive resist process (which removes exposed resist). The latter two steps may not be necessary in all systems, for example in an electron-beam etch system where the electron beam physically etches the substrate without need for a resist step. Soft lithography systems will often (but not always) omit the developing step 210.

The foregoing detailed description has set forth various embodiments, some of which incorporate logic and/or circuits, via the use of block diagrams, flow diagrams, operation diagrams, flowcharts, illustrations, and/or examples. Insofar as such block diagrams, operation diagrams, flowcharts, illustrations, and/or examples contain one or more functions, operations, or data structures to be performed, manipulated, or stored by logic and/or circuits, it will be understood by those within the art that each such logic and/or circuit can be embodied, individually and/or collectively, by a wide range of hardware, software, firmware, or virtually any combination thereof. For example, some embodiments of the subject matter described herein may be implemented via Application Specific Integrated Circuits (ASICs), Field Programmable Gate Arrays (FPGAs), digital signal processors (DSPs), or other integrated formats. However, those skilled in the art will recognize that other embodiments disclosed herein can be equivalently implemented in whole or in part in standard integrated circuits, as one or more computer programs running on one or more computers (e.g., as one or more programs running on one or more computer systems), as one or more programs running on one or more processors (e.g., as one or more programs running on one or more microprocessors), as firmware, as analog circuitry, or as virtually any combination thereof, and that designing the circuitry and/or writing the code for the software and or firmware would be well within the skill of one of skill in the art in light of this disclosure. In addition, those skilled in the art will appreciate that the operations, functions, and data described herein are capable of being distributed or stored in a variety of signal bearing media. Examples of a signal bearing medium include, but are not limited to, recordable type media such as floppy disks, hard disk drives, CD ROMs, digital tape, and computer memory, and transmission type media such as digital and analog communication links using TDM or IP based communication links (e.g., packet links). The choice of signal bearing medium will generally be a design choice representing tradeoffs between cost, efficiency, flexibility, and other implementation considerations in a particular context, and none of these signal bearing media is inherently superior to the other.

Other embodiments of the invention will be apparent to those skilled in the art from a consideration of the specification or practice of the invention disclosed herein. It is intended that the specification be considered as exemplary only, with the true scope and spirit of the invention being indicated by the following claims.

The invention claimed is:

1. A lithography apparatus, comprising:
   a mask holder having a mask location;
   a substrate holder having a substrate location; and
   a positioner that shifts the relative positions of the mask holder and the substrate holder from a first arrangement to a second arrangement having a selected relationship between the mask location and the substrate location, the positioner including an electroactive polymer member configured to shift the relative positions from the first arrangement to the second arrangement.

2. The apparatus of claim 1, further comprising an electrode in electrical communication with the electroactive polymer member, wherein application of a voltage to the electrode actuates the electroactive polymer member.

3. The apparatus of claim 1, wherein application of a magnetic field actuates the electroactive polymer member.

4. The apparatus of claim 1, further comprising:
   a distance sensor that monitors relative positioning of the mask position and the substrate position; and
   a controller that controls the shifting of the positioner in response to the distance sensor.

5. The apparatus of claim 4, wherein the distance sensor monitors the distance between the mask position and the substrate position at a plurality of locations.

6. The apparatus of claim 4, wherein the positioner comprises a plurality of active regions, and wherein the controller separately controls the shifting of each active region.

7. The apparatus of claim 1, wherein in the second arrangement, a mask in the mask position and a substrate in the substrate position are in contact.

8. The apparatus of claim 7, further comprising:
   a force sensor that monitors a contact force between the mask and the substrate; and
   a controller that controls the shifting of the positioner in response to the monitored contact force.

9. The apparatus of claim 7, further comprising a force sensor that monitors a contact force between the mask and the substrate at a plurality of locations, wherein the positioner comprises a plurality of active regions, and wherein the controller separately controls the shifting of each active region in response to the monitored contact forces between the mask and the substrate at one or more of the plurality of locations.

10. The apparatus of claim 1, wherein the positioner acts to flatten a mask in the mask position or a substrate in the substrate position.

11. The apparatus of claim 10, wherein the positioner comprises a plurality of active regions, and wherein each active region may be separately actuated to shift an adjacent portion of the mask or the substrate.

12. The apparatus of claim 1, further comprising a mask in the mask location, wherein the mask emits light.

13. The apparatus of claim 1, further comprising
    a mask in the mask location; and
    a substrate in the substrate location,
    wherein the mask has a physical effect on a surface of the substrate when the mask and the surface of the substrate are brought into contact.

14. A mask moving system, comprising:
    a mask holder; and
    an electroactive polymer member coupled for force transfer to the mask holder.

15. The system of claim 14, further comprising:
    a position monitor coupled to detect a position of the mask holder relative to a substrate; and
    a controller that controls a degree of actuation of the electroactive polymer member in response to the detected position of the mask holder relative to the substrate.

16. A lithographic apparatus, comprising:
    an illumination system oriented to provide activating energy to an illumination site; and
    a positioning apparatus including an electroactive polymer-based movement mechanism.

17. The apparatus of claim 16, further comprising an object holder configured to position an object in proximity to the illumination site, wherein the electroactive polymer-based movement mechanism is coupled to the object holder.

18. The apparatus of claim 16, further comprising a substrate support configured to hold a substrate substantially at the illumination site, wherein the electroactive polymer-based movement mechanism is coupled to the substrate support.

19. The apparatus of claim 16, wherein the positioning apparatus is configured to move the illumination site.

20. A controller for a lithographic system, comprising:
a receiver that receives a distance measurement signal;
a processor that uses the distance measurement signal to determine an actuation profile for an electroactive polymer member; and
an output that actuates the electroactive polymer member according to the actuation profile.

21. The controller of claim 20, wherein the distance measurement signal comprises a plurality of distance measurements.

22. The controller of claim 20, wherein the electroactive polymer member is positioned to shift a first surface relative to a second surface, and wherein the actuation profile is selected to conform the first surface to the second surface.

23. A controller for a lithographic system, comprising:
a receiver that receives a force measurement signal;
a processor that uses the force measurement signal to determine an actuation profile for an electroactive polymer member; and
an output that actuates the electroactive polymer member according to the actuation profile.

24. The controller of claim 23, wherein the force measurement signal comprises a plurality of force measurements.

25. The controller of claim 23, wherein the electroactive polymer member is positioned to shift a first surface relative to a second surface, and wherein the actuation profile is selected to conform the first surface to the second surface.

26. The system of claim 14, further comprising a controller that controls a degree of actuation of the electroactive polymer member.

27. The system of claim 14, further comprising an electrode in electrical communication with the electroactive polymer member, wherein application of a voltage to the electrode actuates the electroactive polymer member.

28. The system of claim 14, wherein application of a magnetic field actuates the electroactive polymer member.

29. The system of claim 14, further comprising a position monitor coupled to detect a position of the mask holder relative to a substrate.

30. The system of claim 29, wherein the position monitor monitors a contact force to detect the position of the mask holder relative to the substrate.

31. The system of claim 29, wherein the position monitor monitors a distance to detect the position of the mask holder relative to the substrate.

32. The system of claim 31, wherein the position monitor monitors the distance optically.

33. The system of claim 31, wherein the position monitor monitors the distance capacitively.

34. The system of claim 31, wherein the position monitor monitors the distance inductively.

35. The system of claim 31, wherein the position monitor monitors the distance by atomic force measurement.

36. The system of claim 31, wherein the position monitor monitors the distance by evanescent wave coupling.

37. The system of claim 29, wherein the position monitor monitors a contact force and a distance to detect the position of the mask holder relative to the substrate.

38. The system of claim 29, wherein the position monitor detects the position of the mask holder relative to the substrate at a plurality of locations.

39. The system of claim 14, wherein the electroactive polymer member comprises a plurality of separately actuatable regions.

40. The system of claim 39, further comprising a controller that independently actuates each member of the plurality of separately actuatable regions.

41. The system of claim 40, wherein the separately actuatable regions are disposed so that actuating a subset of the plurality of separately actuatable regions deforms a mask in the mask holder.

42. The system of claim 41, further comprising a position monitor coupled to detect a position of the mask holder relative to a substrate.

43. The system of claim 42, wherein the position monitor monitors a contact force to detect the position of the mask holder relative to the substrate.

44. The system of claim 42, wherein the position monitor monitors a distance to detect the position of the mask holder relative to the substrate.

45. The system of claim 44, wherein the position monitor monitors the distance optically.

46. The system of claim 44, wherein the position monitor monitors the distance capacitively.

47. The system of claim 44, wherein the position monitor monitors the distance inductively.

48. The system of claim 44, wherein the position monitor monitors the distance by atomic force measurement.

49. The system of claim 44, wherein the position monitor monitors the distance by evanescent wave coupling.

50. The system of claim 42, wherein the position monitor detects the position of the mask holder relative to the substrate at a plurality of locations.

51. The system of claim 42, wherein the controller is responsive to the position monitor.

52. The apparatus of claim 16, further comprising an object holder configured to position an object in proximity to the illumination site.

53. The apparatus of claim 52, further comprising a substrate support configured to hold a substrate substantially at the illumination site.

54. The apparatus of claim 52, wherein the positioning apparatus is configured to provide relative movement of the illumination site and the object.

55. The apparatus of claim 52, wherein the electroactive polymer-based movement mechanism is coupled to the object holder.

56. The apparatus of claim 16, further comprising a substrate support configured to hold a substrate substantially at the illumination site.

57. The apparatus of claim 56, wherein the electroactive polymer-based movement mechanism is coupled to the substrate support.

58. The apparatus of claim 16, wherein the positioning apparatus is configured to move the illumination site.

59. The apparatus of claim 16, wherein the activating energy is electromagnetic radiation.

60. The apparatus of claim 16, wherein the activating energy is an electron beam.

61. The apparatus of claim 16, wherein the activating energy is an ion beam.

62. The apparatus of claim 16, wherein the activating energy is an x-ray beam.

63. The apparatus of claim 16, further comprising a beam-directing element that directs the activating energy.

64. The apparatus of claim 63, wherein the beam-directing element comprises a lens.

65. The apparatus of claim 63, wherein the beam-directing element comprises a mirror.

66. The apparatus of claim 63, wherein the beam-directing element comprises an electromagnetic field generator.

67. The apparatus of claim 16, wherein the illumination means provides activating energy to the illumination site in a spatial pattern.

* * * * *